United States Patent
Chang et al.

(10) Patent No.: US 8,012,777 B2
(45) Date of Patent: Sep. 6, 2011

(54) PACKAGING PROCESS OF LIGHT EMITTING DIODE

(75) Inventors: Wen-Sung Chang, Taipei County (TW); Cheng-Ta Kuo, Hsinchu (TW)

(73) Assignee: Lextar Electronics Corp., Hsinchu (TW)

( * ) Notice: Subject to any disclaimer, the term of this patent is extended or adjusted under 35 U.S.C. 154(b) by 0 days.

(21) Appl. No.: 12/496,644

(22) Filed: Jul. 2, 2009

(65) Prior Publication Data

US 2010/0261299 A1    Oct. 14, 2010

(30) Foreign Application Priority Data

Apr. 9, 2009   (TW) ................................ 98111842 A

(51) Int. Cl.
*H01L 21/56* (2006.01)
(52) U.S. Cl. ... 438/26; 438/127; 438/124; 257/E21.302; 257/E21.503
(58) Field of Classification Search ........... 257/E21.302, 257/E21.503, E21.504; 438/26, 127, 124
See application file for complete search history.

(56) References Cited

U.S. PATENT DOCUMENTS

| | | | | |
|---|---|---|---|---|
| 5,120,678 A * | 6/1992 | Moore et al. | | 29/840 |
| 6,243,945 B1 * | 6/2001 | Fujimoto et al. | | 29/841 |
| 6,399,004 B1 * | 6/2002 | Slager | | 264/254 |
| 6,815,263 B2 * | 11/2004 | Rissing et al. | | 438/127 |
| 7,328,735 B2 | 2/2008 | O et al. | | |
| 7,348,220 B2 * | 3/2008 | Ito et al. | | 438/127 |
| 2001/0006456 A1 * | 7/2001 | Fujimoto et al. | | 361/760 |
| 2005/0224974 A1 * | 10/2005 | Nishida et al. | | 257/737 |
| 2005/0263906 A1 * | 12/2005 | Hall | | 257/777 |
| 2007/0289129 A1 * | 12/2007 | Wing et al. | | 29/855 |
| 2008/0021136 A1 * | 1/2008 | Kashiwagi et al. | | 524/101 |
| 2008/0194048 A1 | 8/2008 | Wang et al. | | |
| 2009/0065242 A1 * | 3/2009 | Sato | | 174/255 |
| 2010/0078664 A1 * | 4/2010 | Helbing | | 257/98 |

FOREIGN PATENT DOCUMENTS

| | | |
|---|---|---|
| CN | 101097985 | 1/2008 |
| JP | 2000077440 A * | 3/2000 |
| TW | I235854 | 7/2005 |
| TW | 200713635 | 4/2007 |
| TW | 200820455 | 5/2008 |
| TW | 200834968 | 8/2008 |

* cited by examiner

*Primary Examiner* — George Fourson, III
(74) *Attorney, Agent, or Firm* — Liu & Liu

(57) ABSTRACT

A packaging process of a light emitting diode (LED) is provided. First, an LED chip is bonded with a carrier to electrically connect to each other. After that, the carrier is heated to raise the temperature thereof. Next, an encapsulant is formed on the heated carrier by a dispensing process to encapsulate the LED chip, wherein the viscosity of the encapsulant before contacting the carrier is lower than that of the encapsulant after contacting the carrier. Thereafter, the encapsulant is cured.

20 Claims, 4 Drawing Sheets

PACKAGING PROCESS OF LIGHT EMITTING DIODE

CROSS-REFERENCE TO RELATED APPLICATION

This application claims the priority benefit of Taiwan application serial no. 98111842, filed on Apr. 9, 2009. The entirety of the above-mentioned patent application is hereby incorporated by reference herein and made a part of specification.

BACKGROUND OF THE INVENTION

1. Field of the Invention

The present invention relates to a packaging process of a light emitting diode (LED), and more particularly to a packaging process of an LED capable of increasing the viscosity of an encapsulant of an LED package rapidly.

2. Description of Related Art

Due to the advantages of long lifetime, compactness, high vibration resistance, low heat emission, and low power consumption, light emitting diodes (LEDs) have been widely applied in indicators or light sources of various home appliances and instruments. With recent development towards multicolor and high illumination, the applications of the LEDs are extended to large-sized outdoor billboards, traffic lights, and the like. In the future, the LEDs may become the power-saving and environment-friendly light sources in replacement of tungsten filament lamps and mercury vapor lamps.

Generally, an LED package includes a carrier, an LED chip, and an encapsulant. The LED chip is disposed on the carrier and electrically connected to the same. The encapsulant encapsulates the LED chip and a portion of the carrier to protect the LED chip and expose a portion of the carrier outside of the encapsulant to provide a function of external electrodes. Since light emitted by the LED chip is transmitted to the outside of the LED package through the encapsulant, the encapsulant of the LED not only has a function of protecting the LED chip, but is also closely related to overall light emitting efficiency and optical characteristic of the LED.

In the conventional packaging process of the LED, the manufacture of the encapsulant is generally categorized into compression molding and transfer molding. In the process of compression molding, a substrate having LED chips mounted thereon is inserted into a mold which contains a melted encapsulant, after the encapsulant has been cured, an entire package is released from the mold to complete the encapsulating process. In the process of transfer molding, a substrate having LED chips mounted thereon is clamped by a mold, and a melted encapsulant is injected into the molding cavity of the mold to encapsulate the LED chip, after the encapsulant has been cured, an entire package is released from the mold to complete the encapsulating process.

However, both the compression molding and the transfer molding require molds and expensive injection machines, which results in a certain manufacturing cost. Moreover, a molding cavity of the mold may be deformed or damaged after being used for a period of time, thereby changing a configuration of the encapsulant formed and further affecting yield rate. In addition, since the making and modifying of the molds both require repetitive developments and adjustments, the molds can not be developed and modified quickly according to different designs. As a result, the production time is likely to be delayed. Hence, how to improve the packaging process is one of the issues that have to be conquered in the manufacture of the LED.

SUMMARY OF THE INVENTION

The present invention provided a packaging process of a light emitting diode (LED). The process rapidly increases a viscosity of an encapsulant formed on a carrier.

As embodied and broadly described herein, a packaging process of an LED is provided is the present invention, and includes the following steps. Firstly, an LED chip is bonded with a carrier to electrically connect the LED chip and the carrier. Next, the carrier is heated to raise a temperature of the carrier. Thereafter, an encapsulant is formed on the heated carrier to encapsulate the LED chip, wherein a viscosity of the encapsulant before contacting the carrier is lower than that of the encapsulant after contacting the carrier. Afterwards, the encapsulant is cured.

In one embodiment of the present invention, the process of forming the encapsulant on the heated carrier is performed by a dispensing process.

In one embodiment of the present invention, a processing temperature of bonding the LED chip with the carrier is T1, and a temperature of the heated carrier is T2. Moreover, a temperature difference (T2−T1) ranges from 70° C. to 180° C.

In one embodiment of the present invention, the processing temperature of bonding the LED chip with the carrier ranges from 25° C. to 30° C. On the other hand, the temperature of the heated carrier ranges from 100° C. to 200° C.

In one embodiment of the present invention, the encapsulant is a transparent encapsulant.

In one embodiment of the present invention, the encapsulant is a thermal-setting encapsulant.

In one embodiment of the present invention, the viscosity of the encapsulant before contacting the carrier ranges from 1500 mPas to 4000 mPas.

In one embodiment of the present invention, the process of curing the encapsulant includes pre-curing the encapsulant and fully curing the encapsulant.

In light of the foregoing, since the present invention allows the rapid increase in the viscosity of the encapsulant formed on the carrier by raising the temperature of the carrier, the encapsulant can be formed more efficiently.

In order to make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
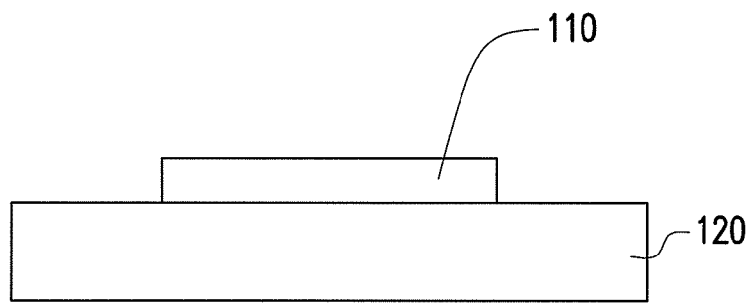
FIGS. 1A~1E are cross-sectional diagrams of a packaging process of an LED according to an embodiment of the present invention.

FIGS. 1A~1E are cross-sectional diagrams of a packaging process of a light emitting diode (LED) according to an embodiment of the present invention. Referring to FIG. 1A, firstly, an LED chip 110 and a carrier 120 are bonded such that the LED chip 110 and the carrier 120 are electrically connected with each other. The carrier 120 can be broadly interpreted as any carrier that is capable of carrying and electrically connecting with the LED chip 110. In the present embodiment, the carrier 120 is a printed circuit board (PCB), and this printed circuit board is manufactured with ceramic material or plastic material, for example. Moreover, the printed circuit board can also be a metal core printed circuit board (MCPCB) with good heat dissipation characteristic or a flexible printed circuit (FPC). In other words, the manufacture of a light emitting diode 100 in the present embodiment is carried out with a chip-on-board (COB) technique. In details, in the COB technique, the LED chip 110 is directly mounted onto a circuit board, and then the LED chip 110 is electrically connected to the circuit board via bonding wires through a wire-bonding process.

The present invention does not specifically limit the type of the carrier 120. In another embodiment of the present invention, the carrier 120 is a leadframe including two leads (not shown) for electrically connecting with the LED chip 110 and a die pad (not shown) for carrying the LED chip 110.

Figure 1B:
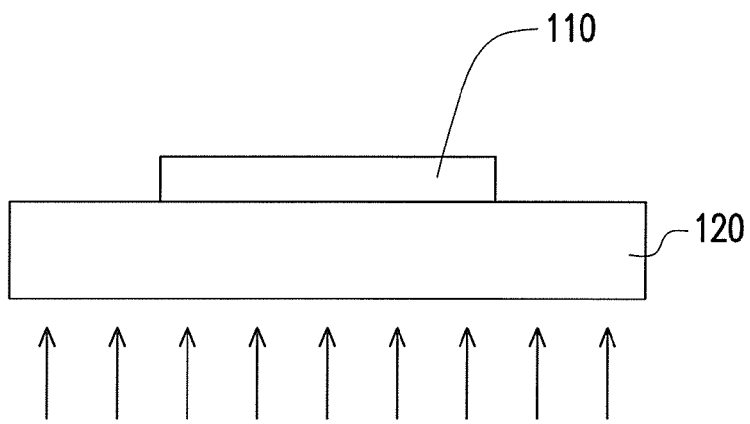

Referring to FIG. 1B, the carrier 120 is then heated to raise a temperature thereof. In the present embodiment, a processing temperature of bonding the LED chip 110 with the carrier 120 is T1, and a temperature of the heated carrier 120 is T2. Moreover, a temperature difference (T2−T1) ranges from 70° C. to 180° C.

Furthermore, in the present embodiment, the processing temperature of bonding the LED chip 110 with the carrier 120 ranges from 25° C. to 30° C. Alternatively, the temperature of the heated carrier 120 ranges from 100° C. to 200° C. Obviously, the present invention does not specifically limit the method of heating the carrier 120, those skilled in the art may adopt suitable processes and apparatuses to heat the carrier 120, and the present embodiment does not limit the method of heating the carrier 120.

Figure 1C:
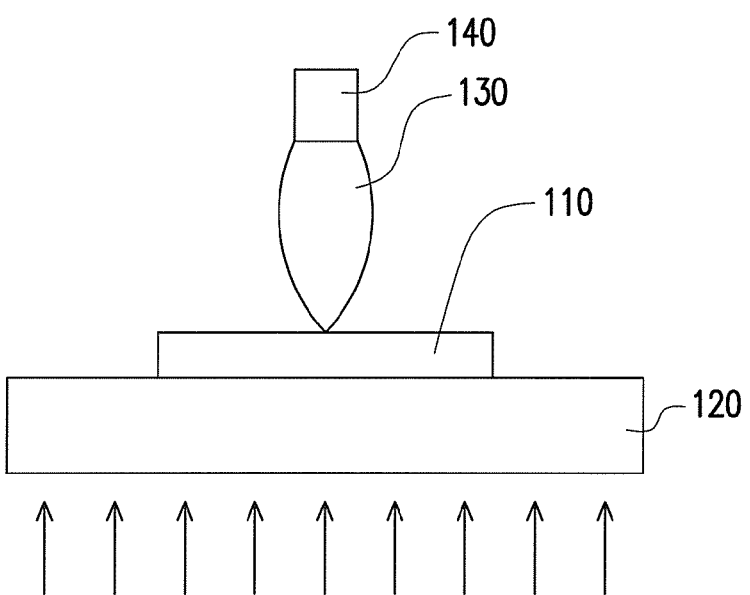
Figure 1D:
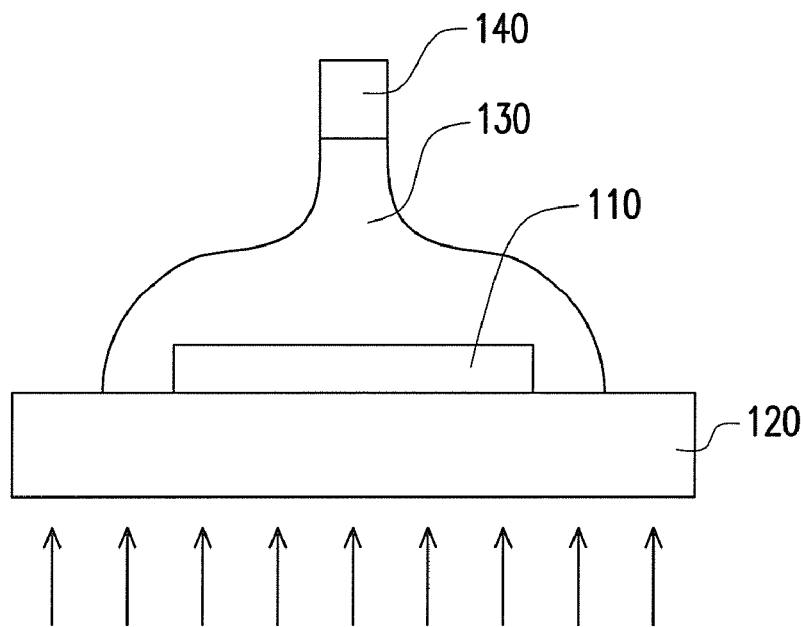
Figure 1E:
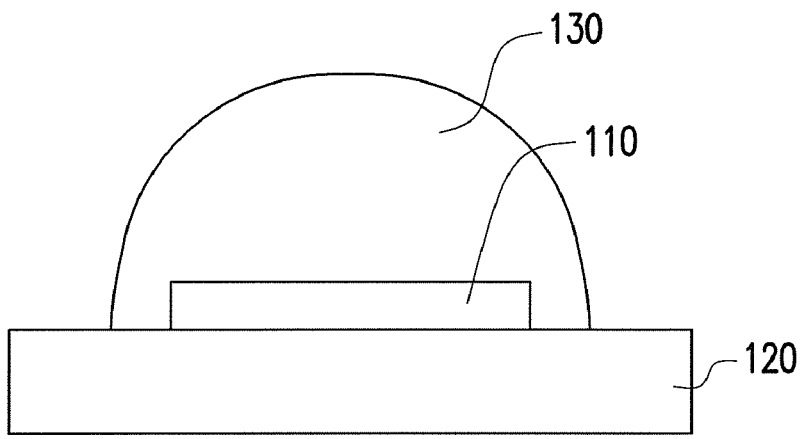

Next, referring to FIGS. 1C~1E, after the carrier 120 has been heated to raise the temperature thereof, a dispensing process, for example, is performed with a dispenser 140 to dispense an encapsulant 130 on the heated carrier 120 for encapsulating the LED chip 110, as illustrated in FIG. 1E.

Specifically, the encapsulant 130 is generally manufactured with materials having high transmittance, so that the light emitted from the LED chip 110 can penetrate the encapsulant 130 and transmits outside of the LED 100.

Moreover, in the present embodiment, the encapsulant 130 is a thermal-setting encapsulant having specific physical or chemical characteristic required by the manufacturing process. For example, the material of the encapsulant 130 is epoxy, polymethyl methacrylate (PMMA), polycarbonate (PC), acrylate, or other optical polymer materials. Similarly, the present invention does not specifically limit the material of the encapsulant 130. For example, the encapsulant 130 may also include nano-particles doped therein. In this case, the light emitted from the LED chip 110 is scattered by the nano-particles such that the light of the LED 100 is more uniform and the intensity of the light emitted by the LED 100 is enhanced.

As aforementioned, in the process of heating the carrier 120 and forming the encapsulant 130 by the dispensing process, the carrier 120 is heated to a specific temperature and the viscosity of the encapsulant 130 changes rapidly after the carrier 120 contacts the encapsulant 130. When the encapsulant 130 contacts the carrier 120, the encapsulant 130 is indirectly heated due to thermal conduction, so that the viscosity of the encapsulant 130 after contacting the carrier 120 increases rapidly.

Next, a curing process is performed to the encapsulant 130. In the present embodiment, a process of curing the encapsulant 130 includes pre-curing the encapsulant 130. More specifically, the pre-curing is carried out at a certain processing temperature, so that the encapsulant 130 is partially cured. In the present embodiment, the temperature of pre-curing ranges from 100° C. to 200° C. Next, the encapsulant 130 is fully cured. For example, the process of curing the encapsulant 130 can be a thermal curing process. In the present embodiment, a temperature of fully curing is approximately 150° C. and a time thereof is approximately 1~2 hours. It should be illustrated that the processing temperatures applied in the pre-curing and the fully curing are generally similar. The difference between the pre-curing and the fully curing is the lengths of the curing time.

Referring to the following experiments, it should be noted that if the carrier 120 is heated before the encapsulant 130 is dispensed on the carrier 120, a positive effect is observed for the increase in the viscosity of the encapsulant 130 which is formed on the carrier 120.

Figure 2:
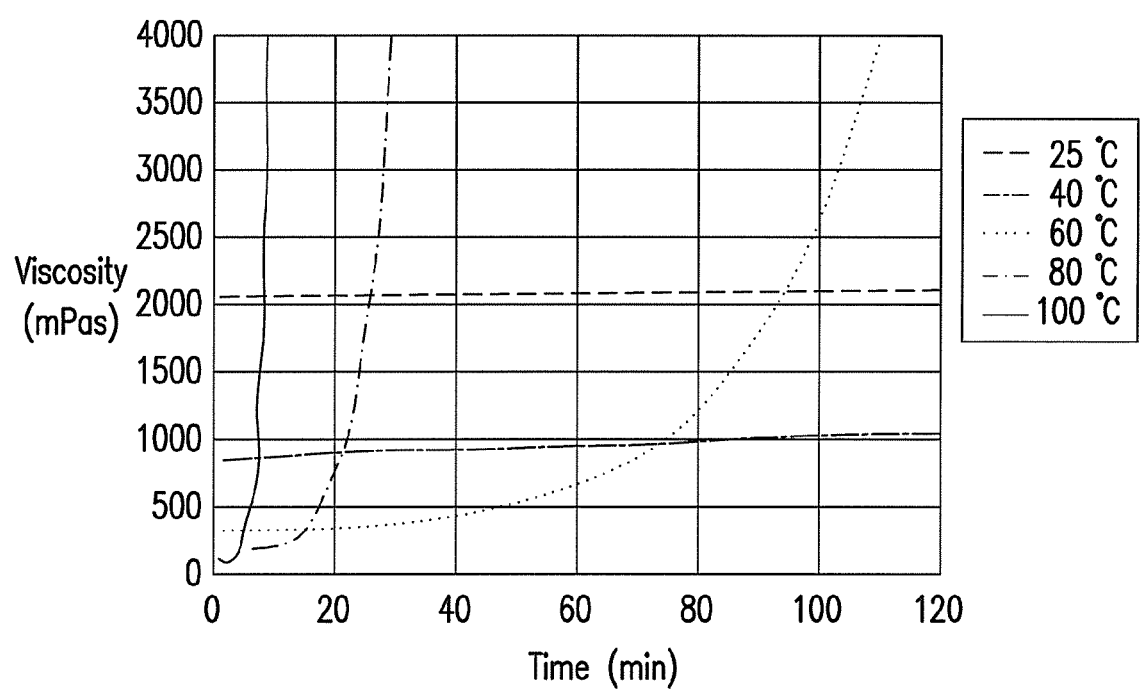
FIGS. 2~4 are graphs illustrating relationships between heating times and viscosities of different encapsulants under different temperatures.
Figure 3:
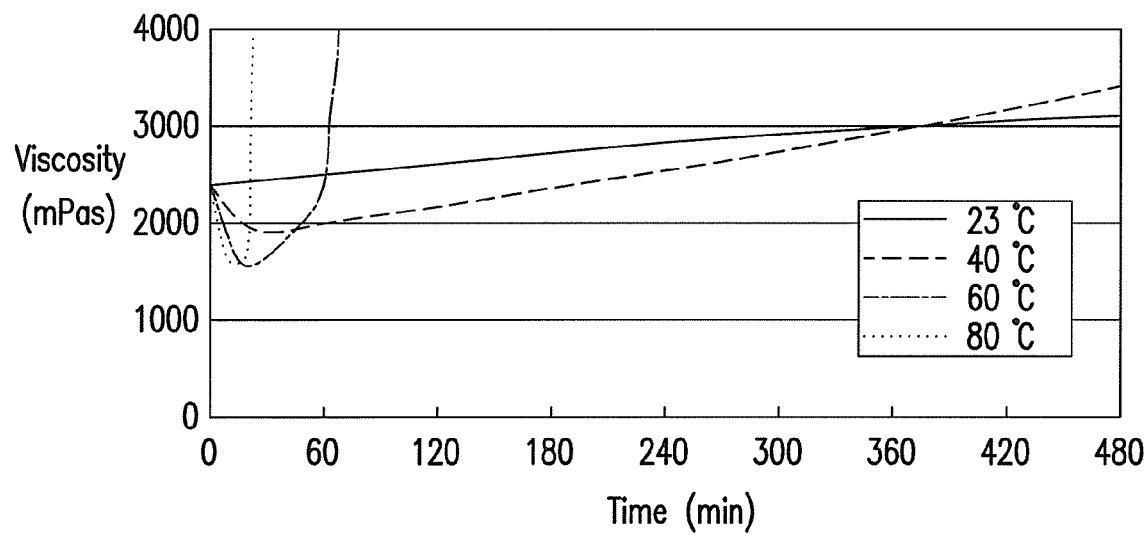
Figure 4:
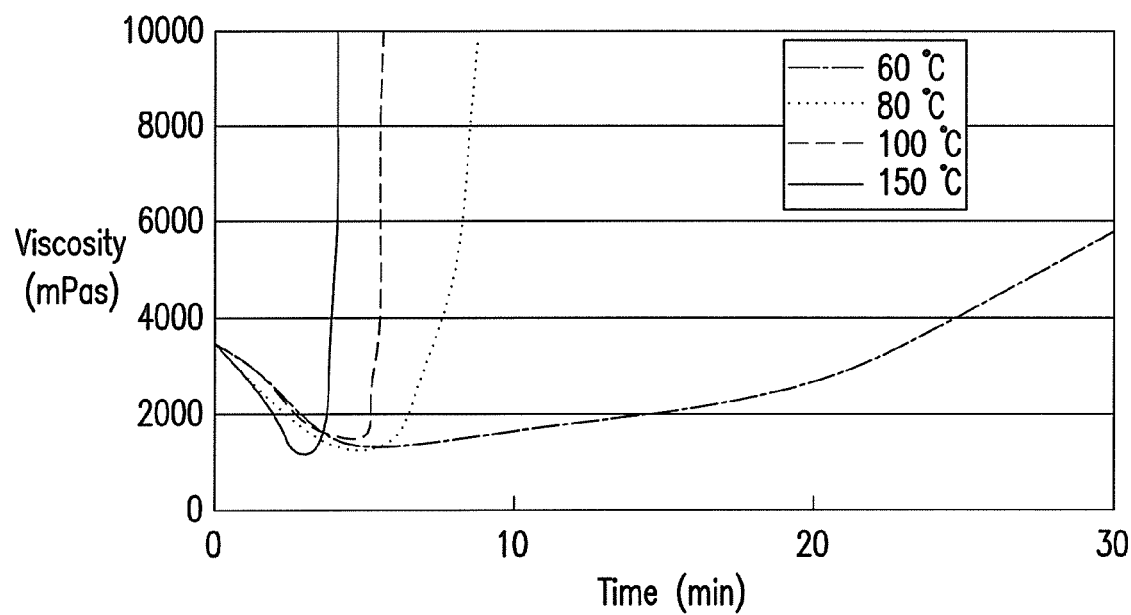

FIGS. 2~4 are graphs illustrating relationships between heating times and viscosities of different encapsulants under different temperatures. Referring to FIG. 2, X-axis denotes the heating time while Y-axis denotes the viscosity of the encapsulant (mPas). In the present embodiment, when the thermal-setting encapsulant is heated from about room temperature and the temperature is set as 25° C. or 40° C. after heating, the viscosity of the thermal-setting encapsulant is substantially unchanged in the 120 minutes of heating time, and the slope of the curve is slightly higher than zero in general.

On the other hand, when the temperature of the thermal-setting encapsulant is 60° C. after the heating, the viscosity of the encapsulant and the rate of increasing viscosity are both dramatically increased starting at the $40^{th}$ minute of heating. From FIG. 2, it is obvious that the slope of the curve is also rapid increased from the $40^{th}$ minute of heating. Specifically, the viscosity rapidly increases at a rate as rapid as at least 3500 mPas in 70 minutes after the $40^{th}$ minute.

When the temperature of the thermal-setting encapsulant is 80° C. or 100° C. after heating, a similar phenomenon occurs. However, the difference between the two is that the time points showing the rapid increasing of the slope after the heating are 15 minutes and 3 minutes, respectively. That is, after been heated for about 15 minutes and 3 minutes, the thermal-setting encapsulant starts to melt and the viscosity thereof increases rapidly. It should be illustrated that in the beginning of the heating process, the raise in the temperature causes the viscosity of the encapsulant to decrease temporarily, but the viscosity increases rapidly later on. This phenomenon does not affect the purpose of rapidly molding the encapsulant in the present invention.

Referring to FIG. 3, the graph showing the relationship between the heating time and the viscosity of the encapsulant is similar to that of FIG. 2. However, the difference between the two is that the type of encapsulant, the temperature, and the heating time in FIG. 3 is different from those illustrated in FIG. 2. In the present embodiment, when the temperature of the thermal-setting encapsulant is 25° C. or 40° C. after heating, the viscosity of the encapsulant generally changes slowly within the heating time of 480 minutes. The viscosities are respectively 2400 mPas~3100 mPas and 2400 mPas~3400 mPas.

When the temperature of the thermal-setting encapsulant is 60° C. after heating, the viscosity thereof and the rate of increasing viscosity are both dramatically increased. When the temperature is 80° C. after heating, the viscosity thereof and the rate of increasing viscosity are increased rapidly after about 20 minutes of heating.

Referring to FIG. 4, the graph showing the relationship between the heating time and the viscosity of the thermal-setting encapsulant is similar to that of FIG. 2. However, the difference between the two is that the type of encapsulant, the temperature, and the heating time in FIG. 4 is different from those illustrated in FIG. 2. In the present embodiment, when the temperature of the thermal-setting encapsulant is 60° C. after heating, the viscosity thereof is substantially 3500 mPas to 5900 mPas within the 30 minutes of heating time. When the temperature is respectively 80° C., 100° C., and 150° C., the viscosities of the thermal-setting encapsulant are increased rapidly after about 7 minutes, 5 minutes, and 4 minutes of heating.

After the encapsulant contacts the heated carrier, the raise in temperature causes the viscosity of the encapsulant to decrease temporarily and increase rapidly later on. Moreover, the faster the raising of the temperature, the faster the rate of increasing the viscosity of the encapsulant; therefore, the encapsulant having predetermined height and shape can be formed rapidly. In practical implementation, the heights and shapes of different encapsulants are obtained by adjusting the heating temperature, the rate of dispensing and choosing encapsulants having different viscosity characteristics.

In the present invention, the encapsulant is heated to a certain temperature so as to increase the viscosity of the encapsulant rapidly. The encapsulant can be rapidly molded by controlling the amount of dispensed encapsulant and the rate of dispensing the encapsulant.

In light of the foregoing, the present invention rapidly enhances the viscosity of the encapsulant formed on the carrier by raising the temperature of the carrier, thereby the encapsulant can be formed more rapidly. In comparison to the conventional packaging process, the packaging process of the LED in the present invention reduces the manufacturing cost of molding process, simplifies the overall manufacturing process, reduces the manufacturing time, and has a high flexibility of modifying the process.

Although the present invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A packaging process of a light emitting diode, comprising:
   bonding a light emitting diode (LED) chip with a carrier to electrically connect the LED chip and the carrier;
   heating the carrier to raise a temperature thereof;
   dispensing an encapsulant onto the heated carrier to encapsulate the LED chip, wherein the temperature of the heated carrier is such to cause the viscosity of the encapsulant to increase rapidly at a rate as rapid as at least 3500 mPas in 70 minutes, such that the encapsulant rapidly forms a predetermined height and shape prior to curing of the encapsulant without using a dam structure; and
   curing the encapsulant after forming the predetermined height and shape.

2. The packaging process of the LED as claimed in claim 1, wherein a viscosity of the encapsulant before contacting the carrier is lower than a viscosity of the encapsulant after being heated by the heated carrier prior to curing of the encapsulant.

3. The packaging process of the LED as claimed in claim 1, wherein the temperature of the heated carrier ranges from 100° C. to 200° C.

4. The packaging process of the LED as claimed in claim 1, wherein the temperature of the heated carrier is raised relative to a processing temperature of bonding the LED chip with the carrier, wherein the processing temperature of bonding the LED chip with the carrier is T1 while the temperature of the heated carrier is T2, and a temperature difference (T2−T1) ranges from 70° C. to 180° C.

5. The packaging process of the LED as claimed in claim 3, wherein the processing temperature of bonding the LED chip with the carrier ranges from 25° C. to 30° C.

6. The packaging process of the LED as claimed in claim 1, wherein the encapsulant is a transparent encapsulant.

7. The packaging process of the LED as claimed in claim 1, wherein the encapsulant is a thermal-setting encapsulant.

8. The packaging process of the LED as claimed in claim 7, wherein the encapsulant comprises nano-particles.

9. The packaging process of the LED as claimed in claim 1, wherein a viscosity of the encapsulant before contacting the carrier ranges from 1500 mPas to 4000 mPas.

10. The packaging process of the LED as claimed in claim 1, wherein a process of curing the encapsulant comprises:
    pre-curing the encapsulant; and
    fully curing the encapsulant.

11. A process of packaging a light emitting diode (LED), comprising:
    supporting an LED chip on a carrier;
    heating the carrier to a desired temperature;
    dispensing an encapsulant onto the heated carrier to cover the LED chip, wherein the temperature of the heated carrier is such to cause the viscosity of the encapsulant to increase rapidly at a rate as rapid as at least 3500 mPas in 70 minutes, such that the encapsulant rapidly forms a predetermined height and shape prior to curing of the encapsulant without using a dam structure; and
    curing the encapsulant after forming the predetermined height and shape.

12. The process as claimed in claim 11, wherein the encapsulant is a thermal-setting encapsulant.

13. The process as claimed in claim 12, wherein a viscosity of the encapsulant before contacting the carrier is lower than a viscosity of the encapsulant after being heated by the heated carrier prior to curing of the encapsulant.

14. The process as claimed in claim 11, wherein the temperature of the heated carrier ranges from 100° C. to 200° C.

15. The process as claimed in claim 14, wherein the processing temperature of bonding the LED chip with the carrier ranges from 25° C. to 30° C.

16. The process as claimed in claim 11, wherein the temperature of the heated carrier is raised relative to a processing temperature of bonding the LED chip with the carrier, wherein the processing temperature of bonding the LED chip with the carrier is T1 while the temperature of the heated carrier is T2, and wherein a temperature difference (T2−T1) ranges from 70° C. to 180° C.

17. The process as claimed in claim 11, wherein the encapsulant is a transparent encapsulant.

18. The process as claimed in claim 11, wherein the encapsulant comprises nano-particles.

19. The process as claimed in claim 11, wherein a viscosity of the encapsulant before contacting the carrier ranges from 1500 mPas to 4000 mPas.

20. The process as claimed in claim 11, wherein curing the encapsulant comprises:

pre-curing the encapsulant; and
fully curing the encapsulant.

* * * * *